(12) United States Patent
Kuramochi et al.

(10) Patent No.: US 9,336,920 B2
(45) Date of Patent: May 10, 2016

(54) COMPOSITE OXIDE SINTERED BODY AND OXIDE TRANSPARENT CONDUCTIVE FILM

(71) Applicant: TOSOH CORPORATION, Shunan-shi, Yamaguchi (JP)

(72) Inventors: Hideto Kuramochi, Ayase (JP); Kimiaki Tamano, Ayase (JP); Ryo Akiike, Ayase (JP); Hitoshi Iigusa, Ayase (JP)

(73) Assignee: TOSOH CORPORATION, Yamaguchi (JP)

( * ) Notice: Subject to any disclaimer, the term of this patent is extended or adjusted under 35 U.S.C. 154(b) by 0 days.

(21) Appl. No.: 14/419,805

(22) PCT Filed: Aug. 8, 2013

(86) PCT No.: PCT/JP2013/071541
§ 371 (c)(1),
(2) Date: Feb. 5, 2015

(87) PCT Pub. No.: WO2014/024986
PCT Pub. Date: Feb. 13, 2014

(65) Prior Publication Data
US 2015/0187548 A1 Jul. 2, 2015

(30) Foreign Application Priority Data

Aug. 8, 2012 (JP) .................................. 2012-176398
Feb. 28, 2013 (JP) .................................. 2013-039515

(51) Int. Cl.
| H01B 1/08 | (2006.01) |
| C23C 14/34 | (2006.01) |
| C04B 35/01 | (2006.01) |
| C04B 35/626 | (2006.01) |
| C23C 14/08 | (2006.01) |
| C04B 35/00 | (2006.01) |
| H01J 37/34 | (2006.01) |

(52) U.S. Cl.
CPC *H01B 1/08* (2013.01); *C04B 35/00* (2013.01); *C04B 35/01* (2013.01); *C04B 35/62695* (2013.01); *C23C 14/086* (2013.01); *C23C 14/34* (2013.01); *C23C 14/3407* (2013.01); *C23C 14/3414* (2013.01); *H01J 37/3429* (2013.01); *C04B 2235/3244* (2013.01); *C04B 2235/3251* (2013.01); *C04B 2235/3286* (2013.01); *C04B 2235/5409* (2013.01); *C04B 2235/5436* (2013.01); *C04B 2235/5445* (2013.01); *C04B 2235/656* (2013.01); *C04B 2235/6562* (2013.01); *C04B 2235/6565* (2013.01); *C04B 2235/6567* (2013.01); *C04B 2235/6585* (2013.01); *C04B 2235/77* (2013.01); *C04B 2235/80* (2013.01); *H01J 2237/332* (2013.01)

(58) Field of Classification Search
CPC ............ H01B 1/00; H01B 1/08; C04B 35/48; C23C 14/34
See application file for complete search history.

(56) References Cited

U.S. PATENT DOCUMENTS

2002/0160236 A1 10/2002 Hattori et al.
2009/0250339 A1 10/2009 Kojima et al.

FOREIGN PATENT DOCUMENTS

| EP | 2428500 A1 | 3/2012 |
| JP | 9-150477 A | 6/1997 |
| JP | 9-209134 A | 8/1997 |
| JP | 2012-17258 A | 1/2002 |
| JP | 2003-132739 A | 5/2003 |
| JP | 2003-239063 A | 8/2003 |
| JP | 2003-105532 A | 9/2003 |
| JP | 2004-149883 A | 5/2004 |
| JP | 2005-56545 A | 3/2005 |
| JP | 2008-195554 | * 8/2008 |

OTHER PUBLICATIONS

Gessert et al "Sputtered In2O3 and ITO thin films containing zirconium", Journal of Applied Physics 105, 083547 6 pages (2009).*
International Preliminary Report on Patentability dated Feb. 19, 2015 issued in International Application No. PCT/JP2013/071541.
Kentaro Utsumi et al., "The Effect of SnO$_2$ Concentration on the Electrical and Optical Properties of In$_2$O$_3$—SnO$_2$ Films", Tosoh Research & Technology Review, 2003, pp. 11-20, vol. 47.
International Search Report for PCT/JP2013/071541 dated Oct. 22, 2013.
Communication dated Feb. 12, 2016 from the European Patent Office in counterpart application No. 13827753.8.

* cited by examiner

Primary Examiner — Mark Kopec
(74) Attorney, Agent, or Firm — Sughrue Mion, PLLC

(57) ABSTRACT

To provide a composite oxide sintered body from which an oxide transparent conductive film having lower light absorption properties in a wide wavelength region and having a low resistance can be obtained, and an oxide transparent conductive film.

A composite oxide sintered body containing indium, zirconium, hafnium and oxygen, wherein the atomic ratio of the elements constituting the sintered body satisfies the following formulae, where In, Zr and Hf are respectively contents of indium, zirconium and hafnium:

Zr/(In+Zr+Hf)=0.05 to 4.5 at %

Hf/(In+Zr+Hf)=0.0002 to 0.15 at %.

17 Claims, No Drawings

COMPOSITE OXIDE SINTERED BODY AND OXIDE TRANSPARENT CONDUCTIVE FILM

CROSS REFERENCE TO RELATED APPLICATIONS

This application is a National Stage of International Application No. PCT/JP2013/071541 filed Aug. 8, 2013, claiming priority based on Japanese Patent Application Nos. 2012-176398 filed Aug. 8, 2012 and 2013-039515 filed Feb. 28, 2013, the contents of all of which are incorporated herein by reference in their entirety.

TECHNICAL FIELD

The present invention relates to a composite oxide sintered body containing indium oxide as the main component, and an oxide transparent conductive film.

BACKGROUND ART

An oxide transparent conductive film has a low resistance and a high transmittance in the visible region and is utilized for an electrode of a light-receiving device such as a display device such as a liquid crystal display or a solar cell, and particularly, an indium oxide film containing tin is widely utilized as an ITO (indium tin oxide) film.

In recent years, as one means to maximize device properties, improvement of electric properties and optical properties to be fitted for desired characteristics is very important, and with respect to the above ITO film, adjustment of electric properties and optical properties has been attempted by adjusting the amount of tin added, however, it has been difficult to improve both the properties simultaneously. For example, Non-Patent Document 1 discloses a $SnO_2$ amount dependence of electro-optical properties of an $In_2O_3$—$SnO_2$ transparent conductive film. According to the document, an $In_2O_3$—$SnO_2$ transparent conductive film has a lowest resistance with a $SnO_2$ amount at a level of 10 wt %. However, with such a $SnO_2$ amount, the plasma wavelength shifts to a short wavelength side, and accordingly such a transparent conductive film has a high light absorptivity in the infrared region and has a low transmittance.

Under these circumstances, it has been attempted to improve properties of a sputtering target and a film obtainable by the target, by adding an element to indium oxide.

Patent Document 1 discloses an oxide sintered body comprising indium, at least one element among a plurality of metal elements, and oxygen, wherein the proportion of the selected metal element is from 2.0 to 40 at %. However, Patent Document 1 only discloses an oxide sintered body having the above metal element added singly.

Patent Document 2 discloses an oxide sintered body comprising indium, at least one element among a plurality of metal elements, and oxygen, wherein the proportion of the selected metal element is from 2.2 to 40 at %. Patent Document 2 discloses zirconium, hafnium and tantalum as the metal element, however, it only discloses an example in which zirconium alone is added in an amount of 2.5 at %, an example in which hafnium alone is added in an amount of 2.5 at %, and an example in which tantalum alone is added in an amount of 2.5 at %.

Patent Documents 3 and 4 disclose a sputtering target comprising indium oxide and having an insulating oxide contained, and discloses as the insulating oxide zirconium oxide and hafnium oxide. However, both the documents failed to disclose an example in which zirconium oxide or hafnium oxide is added.

PRIOR ART DOCUMENTS

Patent Documents

Patent Document 1: JP-A-9-209134
Patent Document 2: JP-A-9-150477
Patent Document 3: JP-A-2003-105532
Patent Document 4: JP-A-2004-149883

Non-Patent Document

Non-Patent Document 1: TOSOH Research & Technology Review, 47, pp. 11-20 (2003)

DISCLOSURE OF INVENTION

Technical Problem

The object of the present invention is to provide a composite oxide sintered body from which an oxide transparent conductive film having lower light absorption properties over a wide wavelength region and having a low resistance can be obtained, and an oxide transparent conductive film.

Another object of the present invention is to provide a laminated substrate comprising a substrate and an oxide transparent conductive film having a sufficiently low resistivity even by a production process in which the maximum temperature in film formation or in device preparation is suppressed to be low.

Solution to Problem

Under these circumstances, as a results of extensive studies, the present inventors have found that a composite oxide sintered body from which an oxide transparent conductive film having both low light absorption properties and low resistance can be obtained, is obtained by adding specific elements in a specific composition to indium oxide, and accomplished the present invention.

That is, the present invention provides a composite oxide sintered body containing indium, zirconium, hafnium and oxygen as constituting elements, wherein the atomic ratio of the elements constituting the sintered body satisfies the following formulae, where In, Zr and Hf are respectively contents of indium, zirconium and hafnium:

Zr/(In+Zr+Hf)=0.05 to 4.5 at %

Hf/(In+Zr+Hf)=0.0002 to 0.15 at %

The atomic ratio of the elements constituting the sintered body preferably satisfies the following formulae:

Zr/(In+Zr+Hf)=0.7 to 3.0 at %

Hf/(In+Zr+Hf)=0.0002 to 0.08 at % more preferably satisfies the following formulae:

Zr/(In+Zr+Hf)=0.7 to 2.1 at %

Hf/(In+Zr+Hf)=0.0002 to 0.08 at %

The oxide sintered body is preferably an oxide sintered body which further contains tantalum as a constituting element, wherein the atomic ratio of the elements constituting the sintered body satisfies the following formula, where Ta is the content of tantalum:

Ta/(In+Zr+Hf+Ta)=0.0002 to 1.5 at % more preferably satisfies the following formula:

(Zr+Hf+Ta)/(In+Zr+Hf+Ta)=0.06 to 2.0 at %

The composite oxide sintered body of the present invention is preferably constituted only by a crystal phase of a bixbyite oxide structure.

The composite oxide sintered body of the present invention preferably has a relative density of at least 97% and an average particle size of at most 8 μm.

The present invention further provides a sputtering target comprising the above composite oxide sintered body.

The present invention further provides a method for producing an oxide transparent conductive film, which comprises sputtering using the above sputtering target.

The present invention further provides an oxide transparent conductive film containing indium, zirconium, hafnium and oxygen as constituting elements, wherein the atomic ratio of the elements constituting the oxide transparent conductive film satisfies the following formulae:

Zr/(In+Zr+Hf)=0.05 to 4.5 at %

Hf/(In+Zr+Hf)=0.0002 to 0.15 at %

The atomic ratio of the elements constituting the oxide transparent conductive film preferably satisfies the following formulae:

Zr/(In+Zr+Hf)=0.7 to 3.0 at %

Hf/(In+Zr+Hf)=0.0002 to 0.08 at % more preferably satisfies the following formulae:

Zr/(In+Zr+Hf)=0.7 to 2.1 at %

Hf/(In+Zr+Hf)=0.0002 to 0.08 at %

The oxide transparent conductive film is preferably an oxide transparent conductive film which further contains tantalum as a constituting element, wherein the atomic ratio of the elements constituting the oxide transparent conductive film satisfies the following formula:

Ta/(In+Zr+Hf+Ta)=0.0002 to 1.5 at % more preferably satisfies the following formula:

(Zr+Hf+Ta)/(In+Zr+Hf+Ta)=0.06 to 2.0 at %

The present invention still further provides a laminated substrate comprising the above oxide transparent conductive film and a substrate, a device which uses the laminated substrate, and an electronic apparatus which uses the device.

Advantageous Effects of Invention

The composite oxide sintered body of the present invention may be used as a sputtering target. By sputtering using such a sputtering target, a low resistance very thin oxide transparent conductive film may be obtained by a low temperature film formation process, and an oxide transparent conductive film having low light absorption properties in a wide wavelength region ranging from the visible region to the infrared region may be obtained.

DESCRIPTION OF EMBODIMENTS

The composite oxide sintered body of the present invention is a composite oxide sintered body containing indium, zirconium, hafnium and oxygen as constituting elements, wherein the atomic ratio (as represented by percentage, the same applies hereinafter) of the elements constituting the sintered body satisfies the following formulae, where In, Zr and Hf are respectively the contents (molar amount, the same applies hereinafter) of indium, zirconium and hafnium:

Zr/(In+Zr+Hf)=0.05 to 4.5 at %

Hf/(In+Zr+Hf)=0.0002 to 0.15 at %

Within such a composition range, a low resistance very thin oxide transparent conductive film having a film thickness at a level of from 5 to 50 nm may be obtained by a low temperature film formation process. Here, In, Zr and Hf are respectively the contents (molar amount) of indium, zirconium and hafnium.

The atomic ratio of the elements constituting the sintered body preferably satisfies the following formulae:

Zr/(In+Zr+Hf)=0.7 to 3.0 at %

Hf/(In+Zr+Hf)=0.0002 to 0.08 at % more preferably satisfies the following formulae:

Zr/(In+Zr+Hf)=0.7 to 2.1 at %

Hf/(In+Zr+Hf)=0.0002 to 0.08 at %

Within such a composition range, in addition to the above properties, abnormal discharge at the time of film formation by sputtering may be suppressed, and an oxide transparent conductive film having low light absorption properties in a wide wavelength region ranging from the visible region to the infrared region may be obtained.

With a view to reducing the resistivity and reducing the light absorptivity of the oxide transparent conductive film, the lower limit of Zr/(In+Zr+Hf) is preferably 0.7 at %. From the same viewpoint, the upper limit of Zr/(In+Zr+Hf) is preferably 3.0 at %, more preferably 2.1 at %.

From the same viewpoint, the upper limit of Hf/(In+Zr+Hf) is preferably 0.08 at %.

The composite oxide sintered body of the present invention may contain tantalum as the constituting element, and the atomic ratio of the elements constituting the sintered body more preferably satisfies the following formula, where In, Zr, Hf and Ta are respectively the contents of indium, zirconium, hafnium and tantalum:

Ta/(In+Zr+Hf+Ta)=0.0002 to 1.5 at % particularly preferably satisfies the following formula:

(Zr+Hf+Ta)/(In+Zr+Hf+Ta)=0.06 to 2.0 at %

Within such a composition range, in addition to the above properties, an oxide transparent conductive film having a sufficiently low resistance may be formed by a production process in which the maximum temperature in film formation or in device preparation is suppressed to be low.

With a view to realizing a sufficiently low resistance by a process in which the maximum temperature in film formation or in device preparation is suppressed to be low, the upper limit of Ta/(In+Zr+Hf+Ta) is preferably 1.0 at %, more preferably 0.7 at %. Further, from the same viewpoint, the lower limit of (Zr+Hf+Ta)/(In+Zr+Hf+Ta) is preferably 0.7 at %, more preferably 0.8 at %.

The composite oxide sintered body of the present invention contains indium, zirconium, hafnium and oxygen, and as the case requires, tantalum. The content of indium in the composite oxide sintered body is preferably at least 95 at %, more preferably at least 95 at %, further preferably from 97 to 99.4 at % based on the total content of the metal elements. The composite oxide sintered body may contain indium oxide as the main component.

The composite oxide sintered body according to this embodiment may contain impurities in inevitably small amounts. Such impurities may be compounds such as oxides containing metal elements other than In, Zr, Hf and Ta. The total content of such impurities in the composite oxide sintered body is preferably at most 1 at %, more preferably at most 0.5 at %, further preferably at most 0.1 at %, particularly preferably at most 0.01 at % as calculated as metal elements based on the total amount of In, Zr, Hf and Ta.

The composite oxide sintered body of the present invention is preferably constituted only by a crystal phase of a bixbyite oxide structure.

By the composite oxide sintered body being constituted only by such a specific crystal phase, abnormal discharge at the time of film formation by sputtering may further be suppressed.

Here, "constituted only by a crystal phase of a bixbyite oxide structure" means that no diffraction peak other than the crystal phase corresponding to a range of $2\theta=20$ to $60°$ in X-ray diffraction test using Cu as a radiation source shown in Examples is detected.

The crystal phase of a bixbyite oxide structure may be confirmed by the diffraction peak detected within a range of $2\theta=20$ to $60°$ in a X-ray diffraction test using Cu as a radiation source being indexed to the peak pattern for indium oxide ($In_2O_3$) according to JCPDS (Joint Committee for Power Diffraction Standards) 6-416, or a peak pattern (shifted peak pattern) similar thereto.

The composite oxide sintered body of the present invention preferably has a relative density of at least 97% and an average particle size of at most 8 μm. By the relative density and the average particle size of the composite oxide sintered body being within such ranges, abnormal discharge at the time of film formation by sputtering may be suppressed, and further, the strength of the oxide sintered body tends to be high, whereby damages such as cracking at the time of film formation by sputtering or at the time of handling may be inhibited.

The relative density of the composite oxide sintered body of the present invention is calculated as follows. That is, the weight ratios of In, Zr, Hf and Ta are determined as the oxides $In_2O_3$, $ZrO_2$, $HfO_2$ and $Ta_2O_5$, respectively. The determined weight ratios of $In_2O_3$, $ZrO_2$, $HfO_2$ and $Ta_2O_5$ are regarded as a (%), b (%), c (%), d (%) respectively. The respective true densities, $In_2O_3$: 7.18 g/cm$^3$, $ZrO_2$: 6.00 g/cm$^3$, $HfO_2$: 9.68 g/cm$^3$ and $Ta_2O_5$: 8.7 g/cm$^3$, are used to calculate the theoretical density A (g/cm$^3$).

$$A=(a+b+c+d)/((a/7.18)+(b/6.00)+c/9.68)+(d/8.7))$$

The density B (g/cm$^3$) of the composite oxide sintered body was measured by Archimedes' method, in accordance with JIS R1634-1998.

The relative density (%) is calculated by the following formula, as the relative value of the density B (g/cm$^3$) of the composite oxide sintered body to the arithmetically calculated theoretical density A (g/cm$^3$).

$$\text{Relative density (\%)}=(B/A)\times 100$$

Further, in the present invention, the average particle size of particles in the sintered body is measured as follows. That is, the composite oxide sintered body is cut to an appropriate size, the surface to be observed is polished, chemical etching is carried out with a dilute hydrochloric acid solution to clarify the grain boundaries. The sample is photographed using EPMA, SEM/EDS, XRD or the like to obtain an observation photograph of the polished surface of the sintered body. The major axes of at least 500 particles of the observation photograph are measured and their arithmetic mean value is calculated and regarded as the average particle size.

Now, the process for producing the composite oxide sintered body of the present invention will be described. The process for producing the composite oxide sintered body of the present invention comprises a mixing step of preparing a powder mixture for molding containing a powder to be an indium source, a powder to be a zirconium source, a powder to be a hafnium source and as the case requires, a powder to be a tantalum source, a molding step of molding the powder mixture to prepare a green body, and a firing step of firing the green body to obtain a composite oxide sintered body. Now, the respective steps will be described in detail.

In the mixing step, a powder mixture for molding containing the above powders is prepared. The method of mixing the material powders is not particularly limited, and the above powders may be mixed simultaneously, or a part of them may be pre-mixed and then the rest is added and mixed.

As the mixing method, preferably, first, the powder to be a zirconium source, the powder to be a hafnium source and as the case requires, the powder to be a tantalum source are pre-mixed, and the mixture is calcined. The material powders are not particularly limited, and considering the handling efficiency, zirconium oxide, hafnium oxide and tantalum oxide are suitable, but nitrates, chlorides, carbonates, alkoxides, and the like of zirconium, hafnium and tantalum to be converted to oxides by firing may also be used. As the particle sizes of such powders, considering the handling efficiency, the average primary particle size is preferably at most 1.5 μm, more preferably from 0.1 to 1.5 μm. By using such powders, an effect to improve the density of the sintered body will be obtained.

In a case where pre-mixing is carried out, the method is not particularly limited, and dry or wet media agitation mill mixing using balls or beads of zirconia, alumina, nylon resin or the like, or medialess rotating vessel mixing or mechanical agitation mixing may, for example, be mentioned. Specifically, a ball mill, a bead mill, an attritor, a vibrating mill, a planetary mill, a jet mill, a V-shaped mixer, a puddle mixer or a biaxial planetary stirring mixer may, for example, be mentioned. When a wet ball mill or bead mill, an attritor, a vibrating mill, a planetary mill, a jet mill or the like is used, the crushed slurry must be dried. The drying method is not particularly limited, and filtration drying, fluidized bed drying or spray-drying may, for example, be mentioned. When a metal salt solution or an alkoxide solution is used as the starting material, the precipitate deposited from the solution is dried.

In a case where pre-mixing is carried out, the obtained pre-mixed powder is preferably calcined at from 800 to 1,400° C. The calcination temperature is more preferably from 1,000 to 1,400° C., and a calcination time of from 1 to 3 hours is enough. The obtained calcined powder is preferably subjected to shredding treatment or the like to an average primary particle size of at most 0.5 μm. The method of the treatment such as shredding is not particularly limited, and the same method as the above pre-mixing may be employed.

Then, an indium oxide powder and the shredded calcined powder are mixed so as to achieve the final composition, to obtain a powder mixture for molding. By using an indium oxide powder, it is possible to minimize complexity of the procedure and reduce auxiliary operations such as powder processing. When the indium source is not an oxide but a nitrate, chloride or carbonate, for example, it may be used after calcination to an oxide. The average particle sizes of the powders are preferably at most 1.5 μm, more preferably from 0.1 to 1.5 μm, considering the handling efficiency. By using such powders, the sintered body density may be improved.

The method of mixing the indium oxide powder and the calcined powder is not particularly limited, and the same method as the above pre-mixing may be employed. The obtained powder mixture for molding is adjusted to have an average primary particle size of at most 1.5 μm, more preferably from 0.1 to 1.5 μm to prepare a powder for molding. It may further be subjected to granulation treatment or the like to improve the operation property in the molding step. Such procedures will improve the molding property and the sintering property.

In the mixing step, the amounts of use of the material powders are preferably such that the composition (final composition) of the powder mixture for molding, as represented by the atomic ratio of the metal element contents, satisfies the following formulae:

Zr/(In+Zr+Hf)=0.05 to 4.5 at %

Hf/(In+Zr+Hf)=0.0002 to 0.15 at % more preferably satisfies the following formulae:

Zr/(In+Zr+Hf)=0.7 to 3.0 at %

Hf/(In+Zr+Hf)=0.0002 to 0.08 at % further preferably satisfies the following formulae:

Zr/(In+Zr+Hf)=0.7 to 2.1 at %

Hf/(In+Zr+Hf)=0.0002 to 0.08 at %

Within such a composition range, it is possible to obtain an oxide transparent conductive film having properties of the present invention. That is, it is possible to obtain a low resistance very thin oxide transparent conductive film having a film thickness at a level of from 5 to 50 nm by a low temperature film formation process, it is possible to suppress abnormal discharge at the time of film formation by sputtering, and it is possible to obtain an oxide transparent conductive film having low light absorption properties within a wide wavelength region ranging from the visible region to the infrared region.

Further, the amounts of use of the material powders are preferably such that the composition (final composition) of a powder mixture for molding, as represented by the atomic ratio of the metal element contents, still further preferably satisfies the following formula:

Ta/(In+Zr+Hf+Ta)=0.0002 to 1.5 at % especially preferably satisfies the following formula:

(Zr+Hf+Ta)/(In+Zr+Hf+Ta)=0.06 to 2.0 at %

Within such a composition range, in addition to the above properties, it is possible to form an oxide transparent conductive film having a sufficiently low resistance realized, by a process in which the maximum temperature in film formation or in device preparation is suppressed to be low.

In the molding step, the powder mixture for molding obtained in the mixing step is molded. The molding method is not particularly limited, and a molding method which allows molding to the desired shape may properly be selected. For example, press molding or cast molding may be mentioned. The molding pressure may be properly set so long as a handleable green body can be prepared without generating cracks, and is not particularly limited. The molding density is preferably as high as possible. A method such as cold isostatic pressure (CIP) molding may be employed for this purpose. If necessary, an organic additive may be used to improve the molding property.

When an additive is used for molding, it is preferred to carry out, prior to the firing step, heat treatment at a temperature of from 80 to 500° C. to remove the moisture and the organic additive remaining in the green body. The temperature for the heat treatment may be properly selected depending upon the amount and the type of remaining moisture and additive.

In the firing step, the green body obtained in the molding step is fired. The temperature-increasing rate is not particularly limited, and is preferably from 10 to 400° C./hour with a view to shortening the firing time and preventing cracking. The firing temperature is preferably at least 1,400° C. and less than 1,650° C., more preferably at least 1,500° C. and at most 1,640° C., whereby a high density sintered body will be obtained. The time for holding the green body at the firing temperature is preferably at least 1 hour, more preferably from 2 to 30 hours, whereby a high density sintered body having a small average particle size will be obtained. The temperature-decreasing rate is not particularly limited so long as it is set within a conventional range, and it is preferably from 10 to 500° C./hour with a view to shortening the firing time and preventing cracking.

The firing is carried out preferably in an oxygen-containing atmosphere, more preferably in an oxygen stream. The firing is particularly preferably carried out in an oxygen stream with a ratio of the weight of the green body (amount charged, kg) to the flow rate (L/min) of oxygen introduced into the furnace at the time of sintering (weight of green body/oxygen flow rate) of at most 1.0, whereby a high density sintered body will be obtained.

The process for producing the composite oxide sintered body of the present invention is not limited to the above process. For example, in the mixing step, the material powders may be mixed all at once to prepare a powder mixture for molding, without carried out pre-mixing and calcination.

The composition of the composite oxide sintered body thus obtained reflects the final composition of the powder.

The sputtering target of the present invention comprises the composite oxide sintered body. Such a sputtering target has excellent discharge properties at the time of film formation by sputtering, and makes stable film formation possible with abnormal discharge suppressed.

In the present invention, the composite oxide sintered body may be used as the sputtering target as it is, or it may be processed into a predetermined shape and used as a sputtering target.

The surface roughness of the sputtering surface of the sputtering target is preferably at most 3 μm, more preferably at most 2 μm, further preferably at most 1 μm as the center line average roughness (Ra). Within such a range, the number of abnormal discharges at the time of film formation by sputtering may further be reduced, and stable film formation is possible. The center line average roughness may be adjusted by a method of machining the sputtering surface of the composite oxide sintered body using different number grinding stones, or a method of vapor blasting, such as sand blasting. Further, the center line average roughness may be determined, for example, by evaluating the sputtering surface with a surface profile measuring apparatus.

Film formation is possible by a sputtering method using the sputtering target of the present invention. Particularly as the sputtering method, DC sputtering, RF sputtering, AC sputtering, DC magnetron sputtering, RF magnetron sputtering, ion beam sputtering or the like may properly be selected. Among them, DC magnetron sputtering or RF magnetron sputtering is preferred, whereby uniform film formation with a large area is possible at a high rate.

The temperature at the time of sputtering is not particularly limited, but is influenced by the heat resistance of a substrate used. For example, when non-alkali glass is used as the substrate, the temperature is usually preferably at most 250° C., and when a resin film is used as the substrate, it is usually preferably at most 150° C. Of course, when a substrate excellent in the heat resistance such as quartz, ceramic, a metal or a heat resistance resin film is used, film formation at a higher temperature is possible.

The atmosphere gas at the time of sputtering is usually an inert gas such as an argon gas. As the case requires, an oxygen gas, a nitrogen gas, a hydrogen gas or the like may be used.

By sputtering using the sputtering target of the present invention, it is possible to obtain a low resistance very thin oxide transparent conductive film having a film thickness at a level of from 5 to 50 nm by a low temperature film formation process and further, to obtain an oxide transparent conductive film having a low resistance even having a film thickness of more than 50 nm, and having low light absorption properties in a wide wavelength region ranging from the visible region to the infrared region.

The oxide transparent conductive film according to this embodiment may realize a further sufficiently low resistance by a production process in which the maximum temperature in film formation or in device preparation is suppressed to be so low as less than 200° C., particularly less than 180° C.

Further, the composition of the oxide transparent conductive film thus obtained reflects the composition of the target used in sputtering. That is, by using the sputtering target of the present invention, it is possible to obtain an oxide transparent conductive film having a composition of $Zr/(In+Zr+Hf)=0.05$ to 4.5 at % and $Hf/(In+Zr+Hf)=0.0002$ to 0.15 at %, or in a case where tantalum is contained, a composition of $Ta/(In+Zr+Hf+Ta)=0.0002$ to 1.5 at %.

Accordingly, the oxide transparent conductive film contains a composition oxide comprising as constituting elements indium, zirconium, hafnium and as the case requires, tantalum, and oxygen. Preferred ranges of the indium content, the zirconium content, the hafnium content and the tantalum content in the oxide transparent conductive film are the same as those of the oxide sintered body of the present invention.

With a view to reducing the number of abnormal discharges at the time of film formation of the oxide transparent conductive film, reducing the resistivity and reducing the light absorptivity, the lower limit of $Zr/(In+Zr+Hf)$ is preferably 0.7 at %. From the same viewpoint, the upper limit of $Zr(In+Zr+Hf)$ is preferably 3.0 at %, more preferably 2.1 at %.

From the same viewpoint, the upper limit of $Hf(In+Zr+Hf)$ is preferably 0.08 at %.

With a view to satisfying both low resistivity and low light absorptivity of the oxide transparent conductive film at higher levels, the oxide transparent conductive film satisfies $Zr/(In+Zr+Hf)$ of preferably from 0.7 to 3.0 at %, more preferably from 0.7 to 2.1 at %, and satisfies $Hf/(In+Zr+Hf)$ of preferably from 0.0002 to 0.08 at %.

With a view to realizing a sufficiently low resistance of the oxide transparent conductive film by a production process in which the maximum temperature in film formation or in device preparation is suppressed to be low, $Ta/(In+Zr+Hf+Ta)$ is preferably from 0.0002 to 1.5 at %, more preferably from 0.0002 to 1.0 at %, further preferably from 0.0002 to 0.7 at %.

From the same viewpoint, $(Zr+Hf+Ta)/(In+Zr+Hf+Ta)$ is preferably from 0.06 to 2.0 at %, more preferably from 0.7 to 2.0 at %, further preferably from 0.8 to 2.0 at %.

The oxide transparent conductive film according to this embodiment may contain impurities in inevitably small amounts. Such impurities may be compounds such as oxides containing metal elements other than In, Zr, Hf and Ta. The total content of such impurities is preferably at most 1 at %, more preferably at most 0.5 at %, further preferably at most 0.1 at %, particularly preferably at most 0.01 at %, as calculated as metal elements, based on the total amount of In, Zr, Hf and Ta.

The above oxide transparent conductive film may be used, for example, for a solar cell, whereby optical loss and heat generation by light absorption may be suppressed as compared with a conventional product. The solar cell here may, for example, be a solar cell using an oxide transparent conductive film, such as a silicon solar cell using single crystal silicon, polycrystalline silicon or amorphous silicon, a compound solar cell using $CuInSe_2$, $Cu(In, Ga)Se_2$, GaAs, CdTe or the like, or a dye-sensitized solar cell.

Further, the above oxide transparent conductive film is adjusted to have an appropriate film thickness mainly depending upon the purpose of use. For example, in a case where it is used for e.g. an electrode of a light-receiving device such as a solar cell, its film thickness is adjusted to a level of from 100 nm to 300 nm in many cases. Further, for application to a display device such as a liquid crystal display device, particularly a touch panel, a flexible substrate using a resin film is employed in many cases, and it is adjusted to be a very thin film having a film thickness at a level of from 5 to 50 nm, and since a resin film is used, it is essential to suppress the maximum temperature in the film formation process to be low, and thus the oxide transparent conductive film is suitably used.

The oxide transparent conductive film of the present invention may be suitably used for a laminated substrate comprising a substrate and the constituted oxide transparent conductive film.

Here, the substrate may, for example, be a glass substrate made of non-alkali glass, quartz or the like, a polymer film substrate made of a resin, or a ceramic or metal substrate. Particularly for a display device, visibility is very important, and accordingly a glass substrate made of non-alkali glass, quartz or the like, or a polymer film substrate made of a resin is suitable.

Such a laminated substrate is suitably used for a device as assembled with a plurality of functional members. It may, for example, be suitably used for an optical device such as a solar cell, or a display device such as a FPD or a touch panel. Particularly the above display device is suitably used as assembled in an electronic apparatus, and is particularly suitable for a small-sized high performance electronic apparatus such as a mobile device.

EXAMPLES

Now, the present invention will be described in further detail with reference to the following specific Examples. However, it should be understood that the present invention is by no means restricted thereto. The material powders used and the evaluation methods are as follows.

[Material Powders]

Indium oxide powder purity: 99.99%, average particle size: 0.5 μm

Zirconium oxide powder purity: 99.99%, average particle size: 0.2 μm

Hafnium oxide powder purity: 99.99%, average particle size: 0.2 μm

Tantalum oxide powder purity: 99.99%, average particle size: 0.2 μm

Tin oxide powder purity: 99.99%, average particle size: 0.5 μm

[Evaluation of Composite Oxide Sintered Body]

(Composition)

Quantitatively determined by ICP-MS (inductively coupled plasma-mass spectroscopy) apparatus.

(Relative Density)

Determined as a relative value of the density of a sintered body to the theoretical density, as described above.

(Average Particle Size)

The average particle size of particles constituting the composite oxide sintered body was determined as described above. The observation photograph was obtained using a scanning electron microscope, and the average particle size was determined from 500 particles.

(X-Ray Diffraction Test)

The crystal phase of the composite oxide sintered body was identified by an X-ray diffraction test. Measurement conditions are as follows.

X-ray source: CuKα

Power: 40 kV, 40 mA

Scanning rate: 1°/min

The obtained diffraction pattern was analyzed and classified into 1) bixbyite oxide phase and 2) crystal phase other than 1), and for each of the crystal phases 1) and 2), "A" was assigned if a diffraction peak was identified, and "B" was assigned if it was not.

[Evaluation of Sputtering Target]

(Discharge Properties)

The number of abnormal discharges per hour under the following sputtering conditions was calculated.

Sputtering Conditions

Apparatus: DC magnetron sputtering apparatus (Ulvac, Inc.)

Magnetic field intensity: 1,000 Gauss (directly above target, horizontal component)

Substrate temperature: room temperature (about 25° C.)

Ultimate vacuum: $5 \times 10^{-5}$ Pa

Sputtering gas: argon+oxygen (oxygen/(argon+oxygen)= 0.02 (volume ratio))

Sputtering gas pressure: 0.5 Pa

DC power: 200 W

Sputtering time: 30 hours

[Evaluation of Oxide Transparent Conductive Film]

(Optical Properties: Light Transmittance, Light Absorptivity)

The light transmittance and the light reflectance including the substrate were measured within wavelengths of from 240 nm to 2,600 nm using a spectrophotometer U-4100 (manufactured by Hitachi Ltd.). The light absorptivity A (%) was determined in accordance with the following formula, where T (%) is the obtained light transmittance and R (%) is the light reflectivity:

$$A(\%) = 100 - T - R$$

With respect to the obtained light absorptivity A (%), the average value at wavelengths of from 400 to 600 nm and the average value at wavelengths of from 800 to 1,200 nm were calculated.

(Resistivity)

The resistivity of the thin film was measured by using HL5500 (manufactured by Japan Bio-Rad Laboratories, Inc.).

Example 1

Preparation of Composite Oxide Sintered Body

A zirconium oxide powder and a hafnium oxide powder were mixed to achieve the compositional ratio as identified in Table 1 by a dry ball mill, and the mixture was calcined in the air at 1,300° C. for 2 hours. The obtained calcined powder was pulverized by a wet bead mill and spray-dried by a spray drier to obtain a granulated powder having a BET of 12 m²/g and an average particle size of 80 μm.

Then, the obtained granulated powder and an indium oxide powder were weighed to achieve the final composition as identified in Table 1 and mixed by a dry ball mill. The obtained powder was molded using a die having a diameter of 150 mm under 0.3 ton/cm² and then subjected to CIP molding under 3.0 ton/cm², and the obtained product was placed in a sintering furnace in a pure oxygen atmosphere and fired under the following conditions.

(Firing Conditions)

Temperature-increasing rate: 50° C./hour

Firing temperature: 1,450° C.

Firing time: 10 hours

Firing atmosphere: pure oxygen gas was introduced into the furnace from initial room temperature to 100° C. at the time of temperature-decreasing Temperature-decreasing rate: 100° C./hour Weight of product/oxygen flow rate: 0.9

The obtained sintered product was pulverized and the product phase was identified by a X-ray diffraction test, whereupon a diffraction peak attributable to a bixbyite oxide phase and a trace of a diffraction peak attributable to zirconium oxide were observed.

Preparation of Oxide Transparent Conductive Film

The obtained composite oxide sintered body was processed into a size of 4 inch in diameter, and the surface to be a sputtering surface of a target was polished using a surface grinding machine and diamond abrasive grains with different numbers to adjust the center line average roughness (Ra) thereby to prepare a target.

Using the obtained sputtering target, film formation was carried out by DC magnetron sputtering under the following conditions, followed by post-treatment to obtain an oxide transparent conductive film.

(Sputtering Film Formation Conditions)

Apparatus: DC magnetron sputtering apparatus

Magnetic field intensity: 1,000 Gauss (directly above target, horizontal component)

Substrate temperature: room temperature (25° C.)

Ultimate vacuum: $5 \times 10^{-4}$ Pa

Sputtering gas: argon+oxygen (oxygen/(argon+oxygen) as identified in Table 1 (volume ratio))

Sputtering gas pressure: 0.5 Pa

DC power: 200 W

Film thickness: 20 nm

Substrate used: non-alkali glass (EAGLE XG glass manufactured by Corning, Inc.), thickness: 0.7 mm (Post-Treatment Conditions after Film Formation)

The sample formed on the substrate was subjected to a heat treatment in the air at 170° C. for 60 minutes.

Example 2

Preparation of Composite Oxide Sintered Body

An indium oxide powder, a zirconium oxide powder and a hafnium oxide powder were weighed to achieve the final composition as identified in Table 1 and mixed by a dry ball mill, and the mixture was calcined in the air at 1,300° C. for 2 hours. The obtained calcined powder was pulverized by a wet bead mill and spray-dried by a spray drier to obtain a granulated powder having a BET of 12 $m^2$/g and an average particle size of 20 μm. Then, molding and firing were carried out under the same conditions as in Example 1.

The obtained sintered body was evaluated in the same manner as in Example 1.

Preparation of Oxide Transparent Conductive Film

An oxide transparent conductive film was prepared under the same conditions as in Example 1.

Examples 3 to 25

Preparation of Composite Oxide Sintered Body

A zirconium oxide powder and a hafnium oxide powder were mixed to achieve the compositional ratio as identified in Table 1 and the mixture was calcined in the same manner as in Example 1, followed by granulation to obtain a granulated powder having a BET of 12 $m^2$/g and an average particle size of 20 μm.

Then, a green body was prepared in the same manner as in Example 1 except that an indium oxide powder and the obtained granulated powder were mixed to achieve the final composition as identified in Table 1, and the obtained green body was fired under the same conditions as in Example 1 except that the firing temperature and the firing time were as identified in Table 1 and evaluated.

Preparation of Oxide Transparent Conductive Film

An oxide transparent conductive film was prepared under the same conditions as in Example 1.

Comparative Example 1

Preparation of Composite Oxide Sintered Body

An indium oxide powder was consolidated by a dry ball mill, and the obtained powder was subjected to molding under the same conditions as in Example 1. Then, the green body was fired under the same conditions as in Example 1 except that the firing temperature and the firing time were as identified in Table 1 and evaluated.

Preparation of Oxide Transparent Conductive Film

An oxide transparent conductive film was prepared under the same conditions as in Example 1.

Comparative Example 2

Preparation of Composite Oxide Sintered Body

A zirconium oxide powder was pulverized by a wet bead mill and spray-dried by a spray drier to obtain a granulated powder having a BET of 12 $m^2$/g and an average particle size of 80 μm.

Then, a green body was prepared in the same manner as in Example 1 except that an indium oxide powder and the obtained granulated powder were weighed to achieve the compositional ratio as identified in Table 1, and the obtained green body was fired under the same conditions as in Example 1 except that the firing temperature and the firing time were as identified in Table 1 and evaluated.

Preparation of Oxide Transparent Conductive Film

An oxide transparent conductive film was prepared under the same conditions as in Example 1.

Comparative Examples 3 to 7

Preparation of Composite Oxide Sintered Body

A zirconium oxide powder was pulverized by a wet bead mill and spray-dried by a spray drier to obtain a granulated powder having a BET of 12 $m^2$/g and an average particle size of 20 μm.

Then, an indium oxide powder and the obtained granulated powder were weighed to achieve the final composition as identified in Table 1 and mixed by a dry ball mill, a green body was prepared in the same manner as in Example 1, and the obtained green body was fired under the same conditions as in Example 1 except that the firing temperature and the firing time were as identified in Table 1 and evaluated.

Preparation of Oxide Transparent Conductive Film

An oxide transparent conductive film was prepared under the same conditions as in Example 1.

Comparative Examples 8 to 11

Preparation of Composite Oxide Sintered Body

A green body was prepared in the same manner as in Example 3 except that the composition of the material powders achieved the compositional ratio as identified in Table 1, and the obtained green body was fired under the same conditions as in Example 1 except that the firing temperature and the firing time were as identified in Table 1 and evaluated.

Preparation of Oxide Transparent Conductive Film

An oxide transparent conductive film was prepared under the same conditions as in Example 1.

Reference Example 1

Preparation of Composite Oxide Sintered Body

An indium oxide powder and a tin oxide powder were weighed in a weight ratio of 95:5 and mixed by a dry ball mill.

Then, a green body was prepared in the same manner as in Example 1, and the obtained green body was fired under the same conditions as in Example 1 except that the firing temperature and the firing time were as identified in Table 1 and evaluated.

Preparation of Oxide Transparent Conductive Film

An oxide transparent conductive film was prepared under the same conditions as in Example 1.

The evaluation results in Examples 1 to 25, Comparative Examples 1 to 11 and Reference Example 1 are shown in Table 1.

TABLE 1

| Ex. | In/(In+Zr+Hf) (at %) | Zr/(In+Zr+Hf) (at %) | Hf/(In+Zr+Hf) (at %) | Firing temp. (°C.) | Firing time (hr) | Crystal phase (X-ray diffraction test) Bixbyite structure | Others | Relative density of sintered body (%) | Average particle size of sintered body (μm) | Ra of target (μm) | Film formation atmosphere (oxygen/(argon+oxygen)) | Number of abnormal discharges (number/hr) | Film thickness (nm) | Resistivity (Ω·cm) |
|---|---|---|---|---|---|---|---|---|---|---|---|---|---|---|
| Ex.1 | 98.39 | 1.6 | 0.0008 | 1,450 | 10 | A | A | 90.2 | 2.8 | 0.51 | 0.0 | 92.5 | 20 | $2.5 \times 10^{-4}$ |
| Ex.2 | 98.39 | 1.6 | 0.0008 | 1,450 | 10 | A | B | 90.1 | 2.6 | 0.51 | 0.0 | 68.4 | 20 | $2.5 \times 10^{-4}$ |
| Ex.3 | 98.39 | 1.6 | 0.0008 | 1,600 | 10 | A | B | 99.2 | 5.7 | 0.53 | 0.0 | 3.1 | 20 | $2.5 \times 10^{-4}$ |
| Ex.4 | 98.39 | 1.6 | 0.0008 | 1,620 | 30 | A | B | 99.5 | 10.5 | 0.55 | 0.0 | 5.4 | 20 | $2.5 \times 10^{-4}$ |
| Ex.5 | 99.89 | 0.1 | 0.0002 | 1,620 | 30 | A | B | 99.3 | 12.2 | 0.56 | 0.0 | 5.7 | 20 | $3.5 \times 10^{-4}$ |
| Ex.6 | 99.89 | 0.1 | 0.0002 | 1,600 | 10 | A | B | 99.1 | 5.8 | 0.53 | 0.0 | 2.5 | 20 | $3.5 \times 10^{-4}$ |
| Ex.7 | 99.88 | 0.1 | 0.02 | 1,600 | 10 | A | B | 99.1 | 6.0 | 0.52 | 0.0 | 2.8 | 20 | $3.4 \times 10^{-4}$ |
| Ex.8 | 99.18 | 0.8 | 0.02 | 1,600 | 10 | A | B | 99.2 | 4.7 | 0.52 | 0.0 | 3.1 | 20 | $2.8 \times 10^{-4}$ |
| Ex.9 | 97.96 | 2.0 | 0.04 | 1,600 | 10 | A | B | 99.2 | 5.3 | 0.52 | 0.0 | 3.3 | 20 | $2.7 \times 10^{-4}$ |
| Ex.10 | 97.88 | 2.1 | 0.02 | 1,600 | 10 | A | B | 99.3 | 5.3 | 0.53 | 0.0 | 3.2 | 20 | $2.6 \times 10^{-4}$ |
| Ex.11 | 97.18 | 2.8 | 0.02 | 1,600 | 10 | A | B | 99.5 | 5.6 | 0.51 | 0.0 | 3.3 | 20 | $2.5 \times 10^{-4}$ |
| Ex.12 | 96.38 | 3.6 | 0.02 | 1,600 | 10 | A | B | 99.4 | 5.3 | 0.51 | 0.0 | 3.3 | 20 | $3.2 \times 10^{-4}$ |
| Ex.13 | 95.97 | 4.0 | 0.03 | 1,600 | 10 | A | B | 99.5 | 5.5 | 0.51 | 0.0 | 3.6 | 20 | $3.3 \times 10^{-4}$ |
| Ex.14 | 95.57 | 4.4 | 0.03 | 1,600 | 10 | A | B | 99.5 | 5.0 | 0.50 | 0.0 | 3.6 | 20 | $3.5 \times 10^{-4}$ |
| Ex.15 | 99.12 | 0.8 | 0.08 | 1,600 | 10 | A | B | 99.2 | 5.7 | 0.54 | 0.0 | 3.1 | 20 | $2.9 \times 10^{-4}$ |
| Ex.16 | 97.92 | 2.0 | 0.08 | 1,600 | 10 | A | B | 99.3 | 5.5 | 0.52 | 0.0 | 3.2 | 20 | $2.8 \times 10^{-4}$ |
| Ex.17 | 96.32 | 3.6 | 0.08 | 1,600 | 10 | A | B | 99.4 | 5.3 | 0.53 | 0.0 | 3.3 | 20 | $3.2 \times 10^{-4}$ |
| Ex.18 | 99.08 | 0.8 | 0.12 | 1,600 | 10 | A | B | 99.3 | 4.4 | 0.52 | 0.0 | 3.2 | 20 | $3.3 \times 10^{-4}$ |
| Ex.19 | 97.88 | 2.0 | 0.12 | 1,600 | 10 | A | B | 99.5 | 5.1 | 0.52 | 0.0 | 3.7 | 20 | $3.1 \times 10^{-4}$ |
| Ex.20 | 96.28 | 3.6 | 0.12 | 1,600 | 10 | A | B | 99.5 | 4.8 | 0.50 | 0.0 | 3.7 | 20 | $3.3 \times 10^{-4}$ |
| Ex.21 | 99.59 | 0.4 | 0.0002 | 1,600 | 10 | A | B | 99.1 | 5.4 | 0.53 | 0.0 | 3.1 | 20 | $3.2 \times 10^{-4}$ |
| Ex.22 | 97.49 | 2.5 | 0.0014 | 1,600 | 10 | A | B | 99.1 | 5.7 | 0.53 | 0.0 | 3.1 | 20 | $2.5 \times 10^{-4}$ |
| Ex.23 | 99.09 | 0.8 | 0.11 | 1,600 | 10 | A | B | 99.1 | 5.6 | 0.53 | 0.0 | 3.0 | 20 | $3.3 \times 10^{-4}$ |
| Ex.24 | 98.31 | 1.6 | 0.09 | 1,600 | 10 | A | B | 99.0 | 5.7 | 0.53 | 0.0 | 3.1 | 20 | $3.1 \times 10^{-4}$ |
| Ex.25 | 97.91 | 2.0 | 0.09 | 1,600 | 10 | A | B | 99.2 | 5.6 | 0.54 | 0.0 | 3.2 | 20 | $3.1 \times 10^{-4}$ |
| Comp. Ex.1 | 99.99 | 0.0 | 0 | 1,500 | 5 | A | B | 99.3 | 6.1 | 0.51 | 0.0 | 3.0 | 20 | $5.8 \times 10^{-4}$ |
| Comp. Ex.2 | 97.2 | 2.8 | 0 | 1,450 | 10 | A | A | 90.2 | 2.5 | 0.51 | 0.0 | 98.3 | 20 | $3.8 \times 10^{-4}$ |
| Comp. Ex.3 | 97.2 | 2.8 | 0 | 1,450 | 10 | A | B | 90.3 | 2.5 | 0.51 | 0.0 | 70.5 | 20 | $3.8 \times 10^{-4}$ |
| Comp. Ex.4 | 97.2 | 2.8 | 0 | 1,600 | 10 | A | B | 99.5 | 5.6 | 0.51 | 0.0 | 3.4 | 20 | $3.8 \times 10^{-4}$ |
| Comp. Ex.5 | 99.9 | 0.1 | 0 | 1,600 | 10 | A | B | 99.1 | 5.8 | 0.53 | 0.0 | 2.5 | 20 | $4.6 \times 10^{-4}$ |
| Comp. Ex.6 | 99.2 | 0.8 | 0 | 1,600 | 10 | A | B | 99.2 | 4.9 | 0.52 | 0.0 | 3.3 | 20 | $3.9 \times 10^{-4}$ |
| Comp. Ex.7 | 95.2 | 4.8 | 0 | 1,600 | 10 | A | B | 99.5 | 5.2 | 0.51 | 0.0 | 3.7 | 20 | $4.3 \times 10^{-4}$ |
| Comp. Ex.8 | 95.17 | 4.8 | 0.03 | 1,600 | 10 | A | B | 99.5 | 5.1 | 0.52 | 0.0 | 3.6 | 20 | $4.0 \times 10^{-4}$ |
| Comp. Ex.9 | 95.02 | 4.8 | 0.18 | 1,600 | 10 | A | B | 99.5 | 6.2 | 0.53 | 0.0 | 3.9 | 20 | $4.7 \times 10^{-4}$ |
| Comp. Ex.10 | 99.98 | 0 | 0.02 | 1,600 | 10 | A | B | 99.0 | 5.5 | 0.52 | 0.0 | 3.5 | 20 | $4.5 \times 10^{-4}$ |
| Comp. Ex.11 | 99.92 | 0 | 0.08 | 1,600 | 10 | A | B | 99.1 | 5.4 | 0.51 | 0.0 | 3.3 | 20 | $3.8 \times 10^{-4}$ |
| Ref. Ex.1 | 95 | — | — | 1,550 | 1 | A | B | 99.4 | 5.1 | 0.51 | 0.0 | 3.7 | 20 | $3.9 \times 10^{-4}$ |

Examples 26 to 44

Preparation of Composite Oxide Sintered Body

An indium oxide powder, a zirconium oxide powder and a hafnium oxide powder were weighed to achieve the final composition as identified in Table 2 and mixed by a dry ball mill to obtain a powder mixture having an average particle size of 0.2 μm. Using the obtained powder mixture, a green body was prepared in the same manner as in Example 1, and the obtained green body was fired under the same conditions as in Example 1 except that the firing temperature and the firing time were as identified in Table 2 and evaluated.

Preparation of Oxide Transparent Conductive Film

An oxide transparent conductive film was prepared under the same conditions as in Example 1 except that the film formation atmosphere and the film thickness were as identified in Table 2. After film formation, the sample formed on the substrate was subjected to a heat treatment in the air at 190° C. for 5 minutes.

Examples 45 to 65

Preparation of Composite Oxide Sintered Body

A green body was prepared in the same manner as in Example 3 except that the composition of the material powders achieved the compositional ratio as identified in Table 2, and the obtained green body was fired in under the same conditions as in Example 1 except that the firing temperature and the firing time were as identified in Table 2 and evaluated.

Preparation of Oxide Transparent Conductive Film

An oxide transparent conductive film was prepared under the same conditions as in Example 26 and evaluated.

Comparative Example 12

Preparation of Composite Oxide Sintered Body

An indium oxide powder was consolidated by a dry ball mill, and molding, firing and evaluation were carried out under the same conditions as in Comparative Example 1.

Preparation of Oxide Transparent Conductive Film

An oxide transparent conductive film was prepared and evaluated under the same conditions as in Example 26.

Comparative Examples 13 to 16

Preparation of Composite Oxide Sintered Body

An indium oxide powder and a zirconium oxide powder were weighed to achieve the final composition as identified in Table 2, and a sintered body was prepared and evaluated under the same conditions as in Example 26.

Preparation of Oxide Transparent Conductive Film

An oxide transparent conductive film was prepared and evaluated under the same conditions as in Example 26.

Comparative Examples 17 to 19

Preparation of Composite Oxide Sintered Body

An indium oxide powder and a hafnium oxide powder were weighed to achieve the final composition as identified in Table 2, and a sintered body was prepared and evaluated under the same conditions as in Example 26.

Preparation of Oxide Transparent Conductive Film

An oxide transparent conductive film was prepared and evaluated under the same conditions as in Example 26.

Reference Example 2

Preparation of Composite Oxide Sintered Body

An indium oxide powder and a tin oxide powder were weighed in a weight ratio of 97:3 and mixed by a dry ball mill.

Then, a green body was prepared in the same manner as in Example 1, and the obtained green body was fired under the same conditions as in Example 1 except that the firing temperature and the firing time were as identified in Table 2 and evaluated.

Preparation of Oxide Transparent Conductive Film

An oxide transparent conductive film was prepared and evaluated under the same conditions as in Example 26 except that the film formation atmosphere was as identified in Table 2.

The evaluation results in Examples 26 to 65, Comparative Examples 12 to 19 and Reference Example 2 are shown in Table 2.

TABLE 2

| Ex. | Final composition of powder and composition of sintered body (at %) | | | Firing temp. (° C.) | Firing time (hr) | Crystal phase (X-ray diffraction test) | | Relative density of sintered body (%) |
|---|---|---|---|---|---|---|---|---|
| | In/(In + Zr + Hf) (at %) | Zr/(In + Zr + Hf) (at %) | Hf/(In + Zr + Hf) (at %) | | | Bixbyite structure | Others | |
| Ex.26 | 98.39 | 1.6 | 0.0008 | 1,550 | 5 | A | B | 95.5 |
| Ex.27 | 98.39 | 1.6 | 0.0008 | 1,550 | 10 | A | B | 96.2 |
| Ex.28 | 98.39 | 1.6 | 0.0008 | 1,580 | 5 | A | B | 98.5 |
| Ex.29 | 98.39 | 1.6 | 0.0008 | 1,580 | 10 | A | B | 98.7 |
| Ex.30 | 98.39 | 1.6 | 0.0008 | 1,600 | 5 | A | B | 99.1 |
| Ex.31 | 98.39 | 1.6 | 0.0008 | 1,600 | 10 | A | B | 99.2 |
| Ex.32 | 98.39 | 1.6 | 0.0008 | 1,620 | 5 | A | B | 99.1 |
| Ex.33 | 98.39 | 1.6 | 0.0008 | 1,640 | 5 | A | B | 99.3 |
| Ex.34 | 99.29 | 0.7 | 0.0014 | 1,600 | 10 | A | B | 99.2 |
| Ex.35 | 99.19 | 0.8 | 0.0003 | 1,600 | 10 | A | B | 99.2 |
| Ex.36 | 99.19 | 0.8 | 0.0014 | 1,600 | 10 | A | B | 99.0 |
| Ex.37 | 99.12 | 0.8 | 0.08 | 1,600 | 10 | A | B | 99.2 |
| Ex.38 | 98.39 | 1.6 | 0.0002 | 1,600 | 10 | A | B | 99.1 |
| Ex.39 | 98.39 | 1.6 | 0.0013 | 1,600 | 10 | A | B | 99.2 |
| Ex.40 | 98.33 | 1.6 | 0.07 | 1,600 | 10 | A | B | 99.2 |
| Ex.41 | 97.99 | 2.0 | 0.0004 | 1,600 | 10 | A | B | 99.2 |
| Ex.42 | 97.99 | 2.0 | 0.001 | 1,600 | 10 | A | B | 99.2 |
| Ex.43 | 97.95 | 2.0 | 0.05 | 1,600 | 10 | A | B | 99.3 |
| Ex.44 | 97.89 | 2.1 | 0.0022 | 1,600 | 10 | A | B | 99.3 |

| Ex. | Average particle size of sintered body (μm) | Ra of target (μm) | Film formation atmosphere (oxygen/(argon + oxygen)) | Number of abnormal discharges (number/hr) | Film thickness (nm) | Resistivity ($\Omega \cdot cm$) | Light absorptivity (%) | |
|---|---|---|---|---|---|---|---|---|
| | | | | | | | Wavelength: 400-800 nm (%) | Wavelength: 800-1,200 nm (%) |
| Ex.26 | 3.5 | 0.54 | 0.02 | 40.6 | 150 | $2.6 \times 10^{-4}$ | 0.9 | 1.8 |
| Ex.27 | 3.7 | 0.54 | 0.02 | 27.4 | 150 | $2.6 \times 10^{-4}$ | 0.9 | 1.8 |
| Ex.28 | 4.8 | 0.53 | 0.02 | 4.7 | 150 | $2.6 \times 10^{-4}$ | 0.9 | 1.8 |
| Ex.29 | 4.9 | 0.54 | 0.02 | 4.2 | 150 | $2.6 \times 10^{-4}$ | 0.9 | 1.8 |
| Ex.30 | 5.4 | 0.54 | 0.02 | 3.1 | 150 | $2.6 \times 10^{-4}$ | 0.9 | 1.8 |
| Ex.31 | 5.7 | 0.53 | 0.02 | 3.1 | 150 | $2.6 \times 10^{-4}$ | 0.9 | 1.8 |
| Ex.32 | 7.1 | 0.54 | 0.02 | 3.2 | 150 | $2.6 \times 10^{-4}$ | 0.9 | 1.8 |
| Ex.33 | 7.5 | 0.54 | 0.02 | 3.2 | 150 | $2.6 \times 10^{-4}$ | 0.9 | 1.8 |
| Ex.34 | 7.5 | 0.54 | 0.02 | 3.1 | 150 | $3.0 \times 10^{-4}$ | 1.0 | 1.3 |

TABLE 2-continued

| Ex. | | | | | | | | |
|---|---|---|---|---|---|---|---|---|
| Ex.35 | 5.8 | 0.54 | 0.02 | 3.2 | 150 | $3.0 \times 10^{-4}$ | 1.0 | 1.3 |
| Ex.36 | 5.7 | 0.53 | 0.02 | 3.1 | 150 | $3.0 \times 10^{-4}$ | 0.9 | 1.3 |
| Ex.37 | 5.7 | 0.54 | 0.02 | 3.1 | 150 | $3.0 \times 10^{-4}$ | 1.0 | 1.7 |
| Ex.38 | 5.6 | 0.53 | 0.02 | 3.1 | 150 | $2.6 \times 10^{-4}$ | 0.9 | 1.7 |
| Ex.39 | 5.7 | 0.54 | 0.02 | 3.2 | 150 | $2.8 \times 10^{-4}$ | 0.9 | 1.9 |
| Ex.40 | 5.7 | 0.54 | 0.02 | 3.2 | 150 | $3.0 \times 10^{-4}$ | 0.9 | 1.9 |
| Ex.41 | 5.7 | 0.53 | 0.02 | 3.2 | 150 | $2.8 \times 10^{-4}$ | 1.0 | 1.6 |
| Ex.42 | 5.8 | 0.53 | 0.02 | 3.2 | 150 | $3.0 \times 10^{-4}$ | 1.0 | 1.6 |
| Ex.43 | 5.7 | 0.53 | 0.02 | 3.2 | 150 | $3.0 \times 10^{-4}$ | 1.0 | 1.9 |
| Ex.44 | 5.8 | 0.54 | 0.02 | 3.3 | 150 | $3.0 \times 10^{-4}$ | 1.0 | 1.7 |

| | Final composition of powder and composition of sintered body (at %) | | | Firing temp. (° C.) | Firing time (hr) | Crystal phase (X-ray diffraction test) | | Relative density of sintered body (%) |
|---|---|---|---|---|---|---|---|---|
| Ex. | In/(In + Zr + Hf) (at %) | Zr/(In + Zr + Hf) (at %) | Hf/(In + Zr + Hf) (at %) | | | Bixbyite structure | Others | |
| Ex.45 | 98.39 | 1.6 | 0.0008 | 1,620 | 30 | A | B | 99.5 |
| Ex.46 | 99.89 | 0.1 | 0.0002 | 1,620 | 30 | A | B | 99.3 |
| Ex.47 | 99.89 | 0.1 | 0.0002 | 1,600 | 10 | A | B | 99.1 |
| Ex.48 | 99.88 | 0.1 | 0.02 | 1,600 | 10 | A | B | 99.1 |
| Ex.49 | 99.18 | 0.8 | 0.02 | 1,600 | 10 | A | B | 99.2 |
| Ex.50 | 97.96 | 2.0 | 0.04 | 1,600 | 10 | A | B | 99.2 |
| Ex.51 | 97.88 | 2.1 | 0.02 | 1,600 | 10 | A | B | 99.3 |
| Ex.52 | 97.18 | 2.8 | 0.02 | 1,600 | 10 | A | B | 99.5 |
| Ex.53 | 96.38 | 3.6 | 0.02 | 1,600 | 10 | A | B | 99.4 |
| Ex.54 | 95.97 | 4.0 | 0.03 | 1,600 | 10 | A | B | 99.5 |
| Ex.55 | 95.57 | 4.4 | 0.03 | 1,600 | 10 | A | B | 99.5 |
| Ex.56 | 97.92 | 2.0 | 0.08 | 1,600 | 10 | A | B | 99.3 |
| Ex.57 | 96.32 | 3.6 | 0.08 | 1,600 | 10 | A | B | 99.4 |
| Ex.58 | 99.08 | 0.8 | 0.12 | 1,600 | 10 | A | B | 99.3 |
| Ex.59 | 97.88 | 2.0 | 0.12 | 1,600 | 10 | A | B | 99.5 |
| Ex.60 | 96.28 | 3.6 | 0.12 | 1,600 | 10 | A | B | 99.5 |
| Ex.61 | 99.59 | 0.4 | 0.0002 | 1,600 | 10 | A | B | 99.1 |
| Ex.62 | 97.49 | 2.5 | 0.0014 | 1,600 | 10 | A | B | 99.1 |
| Ex.63 | 99.09 | 0.8 | 0.11 | 1,600 | 10 | A | B | 99.1 |

| | Average particle size of sintered body (μm) | Ra of target (μm) | Film formation atmosphere (oxygen/(argon + oxygen)) | Number of abnormal discharges (number/hr) | Film thickness (nm) | Resistivity (Ω · cm) | Light absorptivity (%) | |
|---|---|---|---|---|---|---|---|---|
| Ex. | | | | | | | Wavelength: 400-800 nm (%) | Wavelength: 800-1,200 nm (%) |
| Ex.45 | 10.5 | 0.55 | 0.02 | 5.4 | 150 | $2.6 \times 10^{-4}$ | 0.9 | 1.8 |
| Ex.46 | 12.2 | 0.56 | 0.02 | 5.7 | 150 | $2.4 \times 10^{-4}$ | 1.6 | 2.3 |
| Ex.47 | 5.8 | 0.53 | 0.02 | 2.5 | 150 | $2.4 \times 10^{-4}$ | 1.6 | 2.3 |
| Ex.48 | 6.0 | 0.52 | 0.02 | 2.8 | 150 | $2.2 \times 10^{-4}$ | 1.6 | 2.2 |
| Ex.49 | 4.7 | 0.52 | 0.02 | 3.1 | 150 | $2.8 \times 10^{-4}$ | 0.9 | 1.6 |
| Ex.50 | 5.3 | 0.52 | 0.02 | 3.3 | 150 | $3.0 \times 10^{-4}$ | 1.0 | 1.9 |
| Ex.51 | 5.3 | 0.53 | 0.02 | 3.2 | 150 | $2.9 \times 10^{-4}$ | 1.0 | 1.8 |
| Ex.52 | 5.6 | 0.51 | 0.02 | 3.3 | 150 | $2.4 \times 10^{-4}$ | 1.3 | 2.1 |
| Ex.53 | 5.3 | 0.51 | 0.02 | 3.3 | 150 | $2.4 \times 10^{-4}$ | 1.6 | 2.3 |
| Ex.54 | 5.5 | 0.51 | 0.02 | 3.6 | 150 | $2.3 \times 10^{-4}$ | 1.6 | 2.3 |
| Ex.55 | 5.0 | 0.50 | 0.02 | 3.6 | 150 | $2.3 \times 10^{-4}$ | 1.6 | 2.3 |
| Ex.56 | 5.5 | 0.52 | 0.02 | 3.2 | 150 | $3.0 \times 10^{-4}$ | 0.9 | 1.8 |
| Ex.57 | 5.3 | 0.53 | 0.02 | 3.3 | 150 | $2.3 \times 10^{-4}$ | 1.3 | 2.2 |
| Ex.58 | 4.4 | 0.52 | 0.02 | 3.2 | 150 | $3.2 \times 10^{-4}$ | 1.7 | 2.6 |
| Ex.59 | 5.1 | 0.52 | 0.02 | 3.7 | 150 | $3.6 \times 10^{-4}$ | 1.5 | 2.3 |
| Ex.60 | 4.8 | 0.50 | 0.02 | 3.7 | 150 | $2.8 \times 10^{-4}$ | 1.3 | 2.4 |
| Ex.61 | 5.4 | 0.53 | 0.02 | 3.1 | 150 | $5.7 \times 10^{-4}$ | 1.2 | 1.7 |
| Ex.62 | 5.7 | 0.53 | 0.02 | 3.1 | 150 | $6.5 \times 10^{-4}$ | 1.5 | 2.5 |
| Ex.63 | 5.6 | 0.53 | 0.02 | 3.0 | 150 | $3.2 \times 10^{-4}$ | 1.7 | 2.7 |

| | Final composition of powder and composition of sintered body (at %) | | | Firing temp. (° C.) | Firing time (hr) | Crystal phase (X-ray diffraction test) | | Relative density of sintered body (%) |
|---|---|---|---|---|---|---|---|---|
| Ex. | In/(In + Zr + Hf) (at %) | Zr/(In + Zr + Hf) (at %) | Hf/(In + Zr + Hf) (at %) | | | Bixbyite structure | Others | |
| Ex.64 | 98.31 | 1.6 | 0.09 | 1,600 | 10 | A | B | 99.0 |
| Ex.65 | 97.91 | 2.0 | 0.09 | 1,600 | 10 | A | B | 99.2 |
| Comp. Ex.12 | 100.0 | 0.0 | 0 | 1,500 | 5 | A | B | 99.3 |
| Comp. Ex.13 | 99.2 | 0.8 | 0 | 1,600 | 10 | A | B | 99.0 |
| Comp. Ex.14 | 98.4 | 1.6 | 0 | 1,600 | 10 | A | B | 99.2 |
| Comp. Ex.15 | 98 | 2.0 | 0 | 1,600 | 10 | A | B | 99.2 |
| Comp. | 97.5 | 2.5 | 0 | 1,600 | 10 | A | B | 99.2 |

TABLE 2-continued

| Ex. | | | | | | | | |
|---|---|---|---|---|---|---|---|---|
| Ex.16 Comp. Ex.17 | 99.93 | 0 | 0.07 | 1,600 | 10 | A | B | 99.0 |
| Comp. Ex.18 | 98.8 | 0 | 1.2 | 1,600 | 10 | A | B | 99.1 |
| Comp. Ex.19 | 97.5 | 0 | 2.5 | 1,600 | 10 | A | B | 99.0 |
| Ref. Ex.2 | 97 | — | — | 1,550 | 1 | A | B | 99.3 |

| Ex. | Average particle size of sintered body (μm) | Ra of target (μm) | Film formation atmosphere (oxygen/(argon + oxygen)) | Number of abnormal discharges (number/hr) | Film thickness (nm) | Resistivity (Ω · cm) | Light absorptivity (%) Wavelength: 400-800 nm (%) | Light absorptivity (%) Wavelength: 800-1,200 nm (%) |
|---|---|---|---|---|---|---|---|---|
| Ex.64 | 5.7 | 0.53 | 0.02 | 3.1 | 150 | $2.9 \times 10^{-4}$ | 1.8 | 2.6 |
| Ex.65 | 5.6 | 0.54 | 0.02 | 3.2 | 150 | $3.9 \times 10^{-4}$ | 1.6 | 2.4 |
| Comp. Ex.12 | 6.1 | 0.51 | 0.02 | 3.0 | 150 | $6.6 \times 10^{-4}$ | 1.3 | 1.4 |
| Comp. Ex.13 | 5.7 | 0.54 | 0.02 | 3.1 | 150 | $3.1 \times 10^{-4}$ | 1.2 | 1.9 |
| Comp. Ex.14 | 5.7 | 0.53 | 0.02 | 3.2 | 150 | $6.7 \times 10^{-4}$ | 1.7 | 2.4 |
| Comp. Ex.15 | 5.7 | 0.53 | 0.02 | 3.3 | 150 | $6.3 \times 10^{-4}$ | 1.8 | 2.6 |
| Comp. Ex.16 | 5.7 | 0.52 | 0.02 | 3.2 | 150 | $7.1 \times 10^{-4}$ | 2.1 | 3.0 |
| Comp. Ex.17 | 5.6 | 0.54 | 0.02 | 3.1 | 150 | $3.2 \times 10^{-4}$ | 2.5 | 2.3 |
| Comp. Ex.18 | 5.6 | 0.54 | 0.02 | 3.2 | 150 | $2.4 \times 10^{-4}$ | 1.9 | 2.9 |
| Comp. Ex.19 | 5.6 | 0.54 | 0.02 | 3.1 | 150 | $2.2 \times 10^{-4}$ | 1.7 | 4.9 |
| Ref. Ex.2 | 6.8 | 0.54 | 0.015 | 3.2 | 150 | $3.0 \times 10^{-4}$ | 1.1 | 5.2 |

Examples 66 to 73

Preparation of Composite Oxide Sintered Body

An indium oxide powder, a zirconium oxide powder, a hafnium oxide powder and a tantalum oxide powder were weighed to achieve the final composition as identified in Table 3 and mixed by a dry ball mill, and the mixture was calcined in the air at 1,300° C. for 2 hours. The obtained calcined powder was pulverized by a wet bead mill and spray-dried by a spray drier to obtain a granulated powder having a BET of 12 m²/g and an average particle size of 20 μm.

The obtained granulated powder was subjected to molding in the same manner as in Example 1, and the obtained green body was fired under the same conditions as in Example 1 except that the firing temperature and the firing time were as identified in Table 3 and evaluated.

Preparation of Oxide Transparent Conductive Film

An oxide transparent conductive film was prepared and evaluated under the same conditions as in Example 1.

Comparative Examples 20 to 21

Preparation of Composite Oxide Sintered Body

An indium oxide powder and a tantalum oxide powder were weighed to achieve the final composition as identified in Table 3 and mixed by a dry ball mill, and the mixture was calcined in the air at 1,300° C. for 2 hours. The obtained calcined powder was pulverized by a wet bead mill and spray-dried by a spray drier to obtain a granulated powder having a BET of 12 m²/g and an average particle size of 20 μm.

The obtained granulated powder was subjected to molding in the same manner as in Example 1, and the obtained green body was fired under the same conditions as in Example 1 except that the firing temperature and the firing time were as identified in Table 3 and evaluated.

Preparation of Oxide Transparent Conductive Film

An oxide transparent conductive film was prepared and evaluated under the same conditions as in Example 1.

The evaluation results in Examples 66 to 73 and Comparative Examples 20 to 21 are shown in Table 3.

TABLE 3

| | Final composition of powder and composition of sintered body (at %) | | | | | | Crystal phase (X-ray diffraction test) | |
|---|---|---|---|---|---|---|---|---|
| Ex. | In/(In + Zr + Hf + Ta) (at %) | Zr/(In + Zr + Hf + Ta) (at %) | Hf/(In + Zr + Hf + Ta) (at %) | Ta/(In + Zr + Hf + Ta) (at %) | Firing temp. (° C.) | Firing time (hr) | Bixbyite structure | Others |
| Ex.66 | 99.07 | 0.8 | 0.0002 | 0.12 | 1,600 | 10 | A | B |
| Ex.67 | 98.49 | 1.0 | 0.0002 | 0.5 | 1,600 | 10 | A | B |
| Ex.68 | 98.28 | 1.6 | 0.02 | 0.1 | 1,600 | 10 | A | B |
| Ex.69 | 98.18 | 1.6 | 0.02 | 0.2 | 1,600 | 10 | A | B |

TABLE 3-continued

| Ex. | | | | | | | | |
|---|---|---|---|---|---|---|---|---|
| Ex.70 | 97.78 | 1.6 | 0.02 | 0.6 | 1,600 | 10 | A | B |
| Ex.70 | 99.07 | 0.8 | 0.0002 | 0.12 | 1,600 | 5 | A | B |
| Ex.72 | 98.49 | 1.0 | 0.0002 | 0.5 | 1,600 | 5 | A | B |
| Ex.73 | 98.18 | 1.6 | 0.02 | 0.2 | 1,600 | 5 | A | B |
| Comp. Ex.20 | 99.85 | 0 | 0 | 0.15 | 1,600 | 10 | A | B |
| Comp. Ex.21 | 98.4 | 0 | 0 | 1.6 | 1,600 | 10 | A | B |

| Ex. | Relative density of sintered body (%) | Average particle size of sintered body (μm) | Ra of target (μm) | Film formation atmosphere (oxygen/(argon + oxygen)) | Number of abnormal discharges (number/hr) | Film thickness (nm) | Resistivity (Ω · cm) |
|---|---|---|---|---|---|---|---|
| Ex.66 | 99.1 | 4.8 | 0.50 | 0.0 | 3.0 | 20 | $2.3 \times 10^{-4}$ |
| Ex.67 | 99.1 | 4.7 | 0.50 | 0.0 | 3.0 | 20 | $2.4 \times 10^{-4}$ |
| Ex.68 | 99.2 | 4.7 | 0.50 | 0.0 | 3.0 | 20 | $2.3 \times 10^{-4}$ |
| Ex.69 | 99.2 | 4.6 | 0.50 | 0.0 | 3.1 | 20 | $2.3 \times 10^{-4}$ |
| Ex.70 | 99.3 | 4.6 | 0.50 | 0.0 | 3.1 | 20 | $2.5 \times 10^{-4}$ |
| Ex.70 | 99.0 | 5.4 | 0.52 | 0.0 | 2.9 | 20 | $2.3 \times 10^{-4}$ |
| Ex.72 | 99.0 | 5.0 | 0.50 | 0.0 | 2.9 | 20 | $2.4 \times 10^{-4}$ |
| Ex.73 | 99.0 | 5.1 | 0.51 | 0.0 | 3.0 | 20 | $2.3 \times 10^{-4}$ |
| Comp. Ex.20 | 99.0 | 5.6 | 0.52 | 0.0 | 3.4 | 20 | $4.4 \times 10^{-4}$ |
| Comp. Ex.21 | 99.3 | 5.3 | 0.52 | 0.0 | 3.4 | 20 | $3.9 \times 10^{-4}$ |

By comparison between Examples 1 to 25 and Comparative Examples 1 to 11, it is found that a low resistance very thin oxide transparent conductive film can be obtained by a low temperature film formation process when the indium, zirconium and hafnium contents satisfy a specific composition range. Reference Example 1 indicates a low resistance very thin ITO film obtained by a low temperature film formation process, and it is found that the film of the present invention achieves a lower resistance by a low temperature process as compared with the ITO film.

Further, by comparison between Examples 26 to 44 and Comparative Examples 12 to 19, it is found that an oxide transparent conductive film having a low resistance and having low light absorption properties in a wide wavelength region ranging from the visible light region to the infrared region can be obtained.

It is found from Examples 66 to 73 that a lower resistance very thin oxide transparent conductive film can be obtained by a low temperature film formation process, by controlling the composition range.

INDUSTRIAL APPLICABILITY

The composite oxide sintered body of the present invention is widely useful for e.g. a sputtering target.

The entire disclosure of Japanese Patent Application No. 2012-176398 filed on Aug. 8, 2012 and Japanese Patent Application No. 2013-039515 filed on Feb. 28, 2013 including specifications, claims, drawings and summaries are incorporated herein by reference in their entireties.

The invention claimed is:

1. A composite oxide sintered body containing indium, zirconium, hafnium and oxygen as constituting elements, wherein the atomic ratio of the elements constituting the sintered body satisfies the following formulae, where In, Zr and Hf are respectively contents of indium, zirconium and hafnium:

Zr/(In+Zr+Hf)=0.05 to 4.5 at %

Hf/(In+Zr+Hf)=0.0002 to 0.15 at %.

2. The composite oxide sintered body according to claim 1, wherein:

Zr/(In+Zr+Hf)=0.7 to 3.0 at %

Hf/(In+Zr+Hf)=0.0002 to 0.08 at %.

3. The composite oxide sintered body according to claim 1, wherein:

Zr/(In+Zr+Hf)=0.7 to 2.1 at %

Hf/(In+Zr+Hf)=0.0002 to 0.08 at %.

4. The composite oxide sintered body according to claim 1, which further contains tantalum as a constituting element, wherein the atomic ratio of tantalum constituting the sintered body satisfies the following formula, where Ta is the content of tantalum:

Ta/(In+Zr+Hf+Ta)=0.0002 to 1.5 at %.

5. The composite oxide sintered body according to claim 1, which further contains tantalum as a constituting element, wherein the atomic ratio of the elements constituting the sintered body satisfies the following formula, where Ta is the content of tantalum:

(Zr+Hf+Ta)/(In+Zr+Hf+Ta)=0.06 to 2.0 at %.

6. The composite oxide sintered body according to claim 1, which is constituted only by a crystal phase of a bixbyite oxide structure.

7. The composite oxide sintered body according to claim 1, which has a relative density of at least 97% and an average particle size of at most 8 μm.

8. A sputtering target comprising the composite oxide sintered body as defined in claim 1.

9. A method for producing an oxide transparent conductive film, which comprises sputtering using the sputtering target as defined in claim 8.

10. An oxide transparent conductive film, which contains indium, zirconium, hafnium and oxygen as constituting elements, wherein the atomic ratio of the elements constituting the oxide transparent conductive film satisfies the following formulae:

Zr/(In+Zr+Hf)=0.05 to 4.5 at %

Hf/(In+Zr+Hf)=0.0002 to 0.15 at %.

11. The oxide transparent conductive film according to claim 10, wherein the atomic ratio of the elements constituting the oxide transparent conductive film satisfies the following formulae:

Zr/(In+Zr+Hf)=0.7 to 3.0 at %

Hf/(In+Zr+Hf)=0.0002 to 0.08 at %.

12. The oxide transparent conductive film according to claim 10, wherein the atomic ratio of the elements constituting the oxide transparent conductive film satisfies the following formulae:

Zr/(In+Zr+Hf)=0.7 to 2.1 at %

Hf/(In+Zr+Hf)=0.0002 to 0.08 at %.

13. The oxide transparent conductive film according to claim 10, which further contains tantalum as a constituting element, wherein the atomic ratio of the elements constituting the oxide transparent conductive film satisfies the following formula:

Ta/(In+Zr+Hf+Ta)=0.0002 to 1.5 at %.

14. The oxide transparent conductive film according to claim 10, which further contains tantalum as a constituting element, wherein the atomic ratio of the elements constituting the oxide transparent conductive film satisfies the following formula:

(Zr+Hf+Ta)/(In+Zr+Hf+Ta)=0.06 to 2.0 at %.

15. A laminated substrate containing an oxide transparent conductive film, which comprises the oxide transparent conductive film as defined in claim 10 and a substrate.

16. A device, which uses the laminated substrate as defined in claim 15.

17. An electronic apparatus, which uses the device as defined in claim 16.

* * * * *